(12) United States Patent
Booth et al.

(10) Patent No.: US 9,277,652 B2
(45) Date of Patent: Mar. 1, 2016

(54) METHOD AND APPARATUS PERTAINING TO A CAVITY-BEARING PRINTED CIRCUIT BOARD

(71) Applicant: Research In Motion Limited, Waterloo (CA)

(72) Inventors: Kevin Edward Booth, Ottawa (CA); Xiaoping Jordge Qin, Ottawa (CA)

(73) Assignee: BlackBerry Limited, Waterloo, Ontario (CA)

( * ) Notice: Subject to any disclaimer, the term of this patent is extended or adjusted under 35 U.S.C. 154(b) by 254 days.

(21) Appl. No.: 13/799,058

(22) Filed: Mar. 13, 2013

(65) Prior Publication Data
US 2014/0262477 A1    Sep. 18, 2014

(51) Int. Cl.
*H05K 13/00* (2006.01)
*H05K 1/18* (2006.01)

(52) U.S. Cl.
CPC ........ *H05K 1/183* (2013.01); *H05K 2201/0723* (2013.01); *Y10T 29/4913* (2015.01)

(58) Field of Classification Search
CPC ..................................................... H05K 13/00
USPC ........................................ 174/388, 254, 50.9; 361/679.01–679.45, 679.55–679.61, 361/724–747, 752–759, 796–837; 257/422, 257/659, E21.5, E23.114, 690, 660, 687, 257/788, 698
See application file for complete search history.

(56) References Cited

U.S. PATENT DOCUMENTS

| | | | | |
|---|---|---|---|---|
| 4,857,668 A * | 8/1989 | Buonanno | ............ | H05K 9/0015 174/354 |
| 5,660,380 A * | 8/1997 | Reis | ...................... | B25B 11/005 269/21 |
| 5,668,406 A * | 9/1997 | Egawa | .................. | H01L 23/552 174/50.59 |
| 5,808,878 A * | 9/1998 | Saito | ...................... | H01L 23/552 257/659 |
| 6,365,963 B1 * | 4/2002 | Shimada | ............... | H01L 21/563 257/686 |
| 6,377,453 B1 * | 4/2002 | Belady | ................. | H05K 9/0007 165/185 |
| 6,472,598 B1 * | 10/2002 | Glenn | ..................... | H01L 23/24 174/260 |
| 6,962,833 B2 * | 11/2005 | Tuttle | .................. | H01L 23/3107 257/E23.114 |

(Continued)

FOREIGN PATENT DOCUMENTS

DE       102006040733 A1    5/2008

OTHER PUBLICATIONS

Extended European Search Report from related European Patent Application No. 13158909.5 dated Oct. 31, 2013; 5 pages.

*Primary Examiner* — Courtney Smith
*Assistant Examiner* — Rashen E Morrison
(74) *Attorney, Agent, or Firm* — Gary Winer; Fleit Gibbons Gutman Bongini & Bianco P.L.

(57) ABSTRACT

A printed circuit board has a cavity formed in at least one side thereof and an electronic component disposed at least partially within that cavity. Electromagnetic interference (EMI)-shielding material is disposed between the electronic component and at least one of the side walls and bottom of this cavity. So configured, the overall height of the combined structure is reduced as compared to a surface-mounted component.

19 Claims, 3 Drawing Sheets

(56) References Cited

U.S. PATENT DOCUMENTS

| | | | |
|---|---|---|---|
| 8,748,229 B2* | 6/2014 | Nishimura | H01L 21/568 257/686 |
| 2004/0155308 A1* | 8/2004 | McFadden | H05K 9/0083 257/422 |
| 2005/0061544 A1* | 3/2005 | Nakakuki | H05K 1/147 174/261 |
| 2009/0200648 A1* | 8/2009 | Graves, Jr. | H01L 23/5389 257/659 |
| 2009/0230537 A1* | 9/2009 | Liu | H01L 21/563 257/690 |
| 2011/0162879 A1* | 7/2011 | Bunyan | H01L 23/552 174/378 |
| 2012/0009738 A1* | 1/2012 | Crawford | H01L 21/6835 438/121 |
| 2012/0108115 A1 | 5/2012 | Hardin et al. | |
| 2014/0078677 A1* | 3/2014 | Dolci | H01L 23/10 361/719 |
| 2014/0262477 A1* | 9/2014 | Booth | H05K 1/183 174/388 |

* cited by examiner

METHOD AND APPARATUS PERTAINING TO A CAVITY-BEARING PRINTED CIRCUIT BOARD

FIELD OF TECHNOLOGY

The present disclosure relates to printed circuit boards and more particularly to the mounting of electrical components with respect to a printed circuit board.

BACKGROUND

Printed circuit boards (PCB's) are known in the art. A typical printed circuit board serves to mechanically support and electrically connect various electronic components using electrically-conductive traces etched from copper sheets and laminated onto a non-conductive substrate. Modern printed circuit boards are often relatively complex and can feature not only conductive traces on both sides of the board but can comprise a laminate of multiple boards such that some conductive traces are disposed on the interior of the final resultant printed circuit board.

Miniaturization, too, is known in the art. Designers often seek to provide ever-smaller electronic devices that provide increased functionality. Sometimes, however, desired size limitations are difficult or impossible to meet using available printed circuit boards and electronic components. For example, in some cases the overall height of a given part when installed on a given printed circuit board may exceed the available vertical space in a given product design.

One typical response when facing such a conundrum is to redesign the electronic component to meet that particular space limitation. In at least some cases, however, such a solution can be prohibitively expensive and/or can pose a significant threat to the design and fabrication time line.

DETAILED DESCRIPTION

Figure 1:
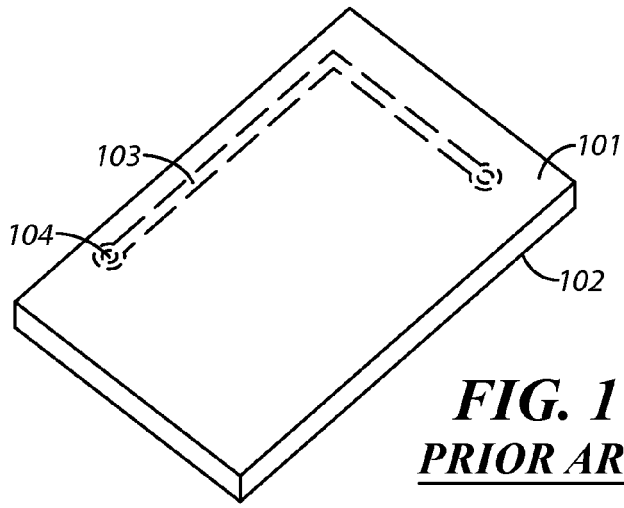
FIG. 1 is a perspective view in accordance with the prior art.

Prior to presenting details regarding the present teachings it may be helpful to first recall certain characterizing features of a typical printed circuit board. FIG. 1 presents an illustrative example in these regards. This printed circuit board 100 comprises a substantially planar substrate having a first side 101 and an opposing second side 102. Most modern printed circuit boards are typically comprised of layers of cloth or paper combined with thermoset resin that form an integral final piece of substantially uniform thickness. The cloth or fiber material used, resin material, and the cloth-to-resin ratio determine the characteristics of the laminate produced with FR-4 being the designation for one very-common printed circuit board material.

Electrically-conductive traces 103 are typically formed on at least one side of the printed circuit board 100 using any of a variety of subtractive (for example, via etching methodologies) and/or additive (for example, via electroplating methodologies) techniques. Double-sided boards or multi-layer boards often use plated-through holes 104, often called vias, to connect electrically-conductive traces on different layers of the printed circuit board.

The following describes an apparatus and method pertaining to forming a cavity in one side of such a printed circuit board and disposing an electronic component at least partially within that cavity. Electromagnetic interference (EMI)-shielding material is disposed between the electronic component and at least one of the side walls and bottom of this cavity. So configured, the overall height of the combined structure is reduced as compared to a surface-mounted component.

By one approach the EMI-shielding material is physically discrete with respect to the electronic component (and hence does not comprise an integral part of the electronic component). In addition, if desired, the EMI-shielding material can further include, at least in part, an electrically-conductive foam that at least partially surrounds a portion of the electronic component that is not disposed within the cavity.

By one approach, the bottom and/or one or more sides of the cavity have an electrically-conductive metal disposed thereon. This electrically-conductive metal, in turn, can also serve as EMI-shielding material to protect the electronic component at least to some extent from unwanted EMI influences.

By one approach the electronic component is physically and electrically connected to a substrate (such as but not limited to a flex planar component) other than the printed circuit board. In any event, the electronic component need not electrically connect to the printed circuit board via a direct connection or even an indirect connection.

These teachings provide an approach that permits a given printed circuit board to accommodate a component in way that might otherwise preclude use of the component in a given application setting. These teachings are also highly flexible in practice and can serve to accommodate a wide variety of components having a wide variety of corresponding sizes and form factors.

For simplicity and clarity of illustration, reference numerals may be repeated among the figures to indicate corresponding or analogous elements. Numerous details are set forth to provide an understanding of the embodiments described herein. The embodiments may be practiced without these details. In other instances, well-known methods, procedures, and components have not been described in detail to avoid obscuring the embodiments described. The description is not to be considered as limited to the scope of the embodiments described herein.

Figure 2:
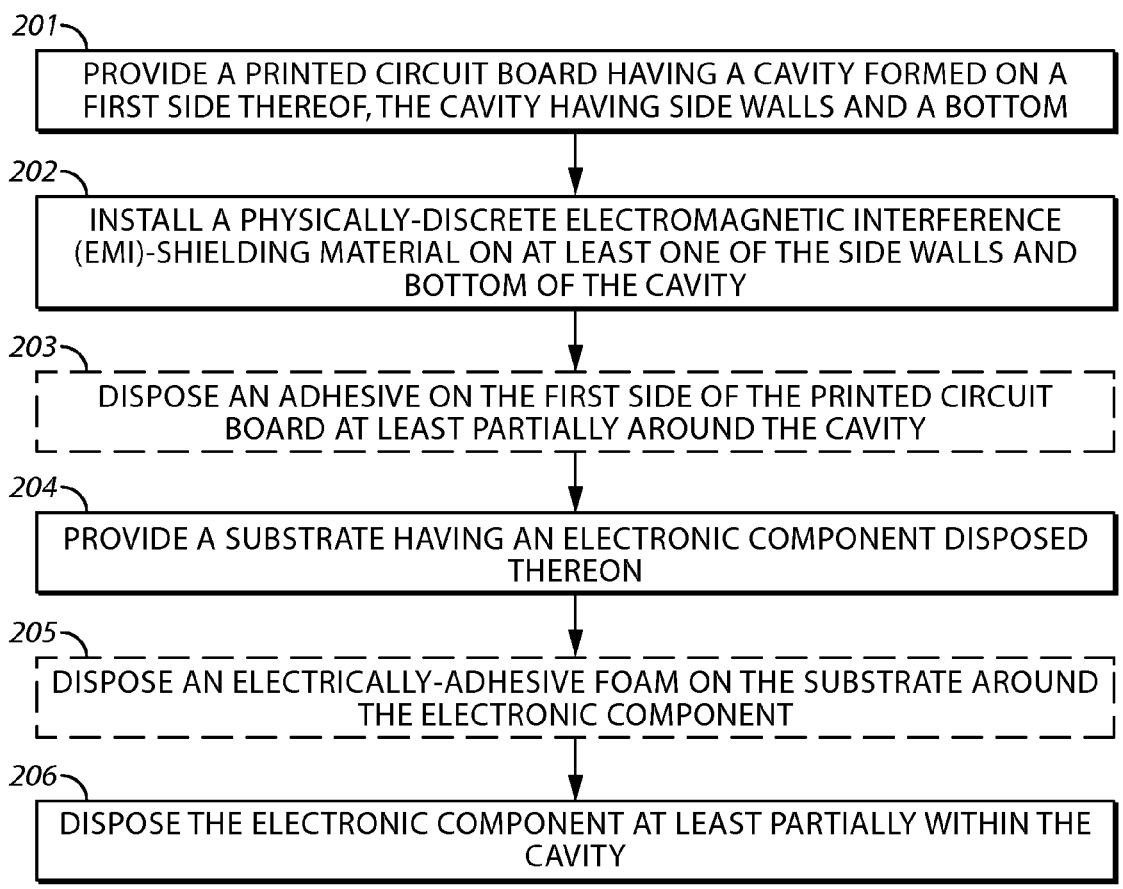
FIG. 2 is a flow diagram in accordance with the disclosure.

FIG. 2 presents a process 200 that accords with many of these teachings. Those skilled in the art will recognize that the specifics of this illustrated process 200 are intended to serve an illustrative purpose and are not intended, by their specificity, to require any particular limitations regarding the practice of these teachings.

Figure 3:
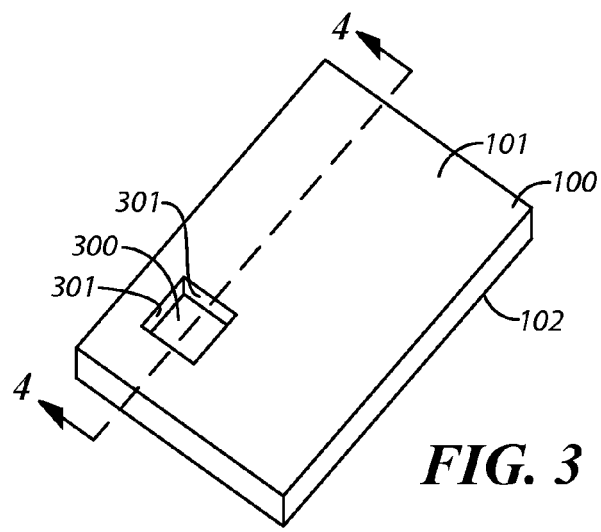
FIG. 3 is a perspective view in accordance with the disclosure.
Figure 4:
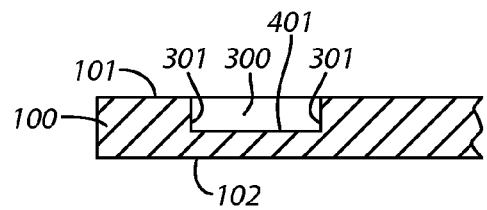
FIG. 4 is a side elevational sectioned view in accordance with the disclosure.

Referring to FIGS. 2-4, at 201 this process 200 provides a printed circuit board 100 having a cavity 300 formed on a first side 101 thereof. This cavity 300 has side walls 301 and a bottom 401. While open on the first side 101, this cavity 300 does not extend through to the opposite side 102 of the printed circuit board 100. (If desired, these teachings will accommodate having, for example, one or more small vias extend from the cavity 300 through to the opposite side 102, but generally speaking the cavity 300 itself stops short of that opposite side 102.)

In this example the cavity 300 comprises a rectangular cuboid. These teachings will accommodate a great variety of practice in these regards, however. The cavity 300, for example, can be as regular and symmetrical or as irregular and as nonsymmetrical as may be desired.

By one approach the printed circuit board 100 is initially formed to include the cavity 300. By another approach the cavity 300 is formed subsequent to forming the printed circuit board 100. For example, a portion of the printed circuit board 100 can be removed to form the cavity 300 via any of a variety of material-removal methodologies. Examples in these regards include but are not limited to any of a variety of abrading processes, heat-based processes, and so forth. As the present teachings are not overly sensitive to any particular choice in these regards, further embellishment is not provided here for the sake of brevity.

In this illustrative example the printed circuit board 100 includes only a single cavity 300. It will be understood, however, that these teachings can serve to provide a printed circuit board 100 having a plurality of such cavities 300. In such a case these teachings will also accommodate having all of the cavities 300 on a same side of the printed circuit board 100 or on both opposing sides of the printed circuit board 100. It will also be understood that such a plurality of cavities 300 need not all be identical in size or shape but rather can vary to suit the needs of a given application setting.

Figure 5:
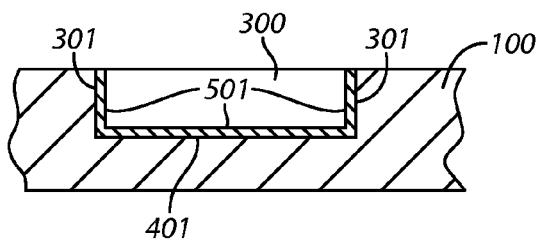
FIG. 5 is a side elevational sectioned view in accordance with the disclosure.

Referring to FIGS. 2 and 5, at 202 an electrically-conductive metal 501 is disposed (at 202) in this illustrative example on the bottom 401 and all of the side walls 301 of the cavity 300. A variety of metals will serve in these regards including, for example, gold and copper as well as a variety of alloys. This electrically-conductive metal 501 serves as an EMI-shielding material and in particular helps to shield the interior of the cavity 300 from EMI as sourced by other components that may be mounted on either side of the printed circuit board 100 or in other printed circuit board cavities.

Notwithstanding this particular example it will be understood that these teachings will accommodate other approaches. For example, for many application settings it may be satisfactory and sufficient to plate only part or all of the bottom 401 of the cavity 300 with an electrically-conductive metal 501.

This electrically-conductive metal 501 can be disposed as described using any of a variety of approaches. Examples include, but are not limited to, electroplating, sputtering, and so forth.

Figure 6:
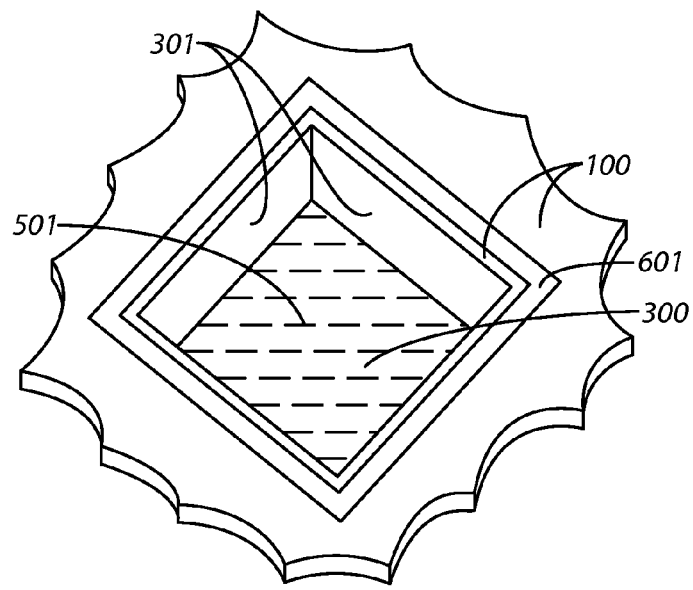
FIG. 6 is a detail perspective view in accordance with the disclosure.

Referring to FIG. 6, at 203 an electrically-conductive adhesive 601 can be optionally placed around the cavity 300. In some cases it may also suffice to utilize adhesive having poor electrical conductivity if desired. Such adhesives are known in the art and those skilled in the art will understand the choices in these regards. In this illustrative example the electrically-conductive adhesive 601 completely surrounds the edges of the cavity 300 while also generally conforming to the shape of the cavity 300. If desired, however, separated dabs or strips of electrically-conductive adhesive 601 can serve in these regards instead.

Figure 7:
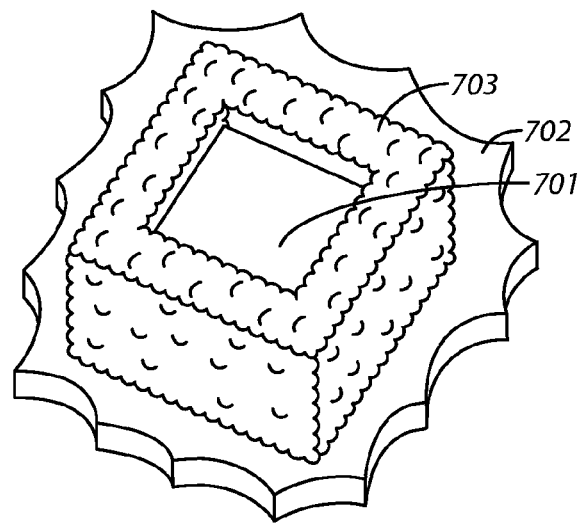
FIG. 7 is a detail perspective view in accordance with the disclosure.

Referring to FIG. 7, at 204 a substrate 702 having at least one electronic component 701 of choice installed thereon is provided. This substrate 702 can vary as desired. By one approach this substrate 702 can comprise a part of a flexible electrical connector (such as a flex planar cable assembly). By another approach this substrate comprises a rigid printed circuit board. Generally speaking, the substrate 702 will have a plurality of electrically-conductive traces (not shown) and the electronic component 701 will physically and electrically connect (via, for example, one or more electrodes as comprise a part of the electronic component 701) to one or more of those electrically-conductive traces. So configured, the electronic component 701 can be electrically connected as desired. This electrical may, or may not, include a direct electrical connection to the printed circuit board 100 itself (and/or to a component that comprises part of a circuit on that printed circuit board 100).

These teachings will accommodate a wide variety of different electronic components. This flexibility includes both individual components (such as transistors, resistors, inductors, and capacitors), integrated circuit dies and packages, and multi-component sub-assemblies. The electronic component 701 may or may not include its own integral EMI shielding as desired.

As will be described momentarily, at least part of this electronic component 701 will be disposed within the aforementioned cavity 300. These teachings will also accommodate a variety of practices as regards the fit of the electronic component 701 in the cavity 300. These teachings will accommodate, for example, having the electronic component 701 fully nested and contained within the interior of the cavity 300 if desired.

In many cases, however, the electronic component 701 will not be fully nested within the cavity 300. In such a case, the electronic component 701 will extend above the first side 101 of the printed circuit board 100. If desired, at 205 and as shown in FIG. 7 an electrically-adhesive foam 703 can be optionally disposed on the substrate 702 around the electronic component 701.

By one approach (and as shown) this electrically-adhesive foam 703 completely surrounds the sides of the electronic component 701. If desired, however, a less than complete surrounding of the electronic component 701 may serve acceptably in some application settings.

Also as shown in FIG. 7, the electrically-adhesive foam 703 extends away from the substrate 702 a distance greater than the height of the electronic component 701. The greater the ratio of the height of the foam 703 to the height of the electronic component 701, the greater the compression of the electrically-adhesive foam 703 when the electronic component 701 is installed within the above-described cavity 300.

Figure 8:
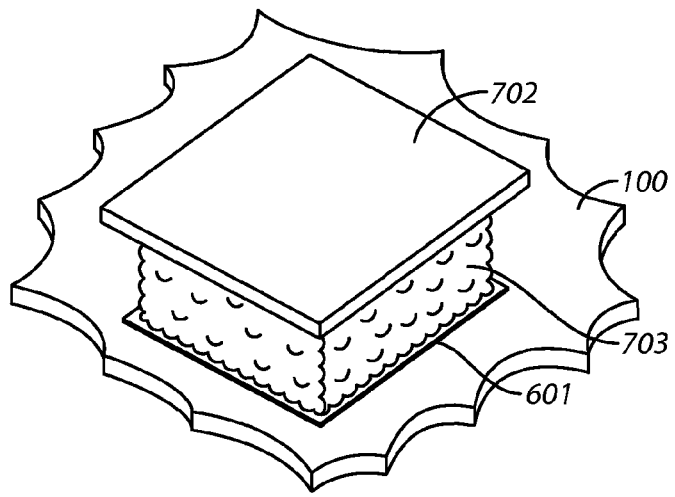
FIG. 8 is a detail perspective view in accordance with the disclosure.
Figure 9:
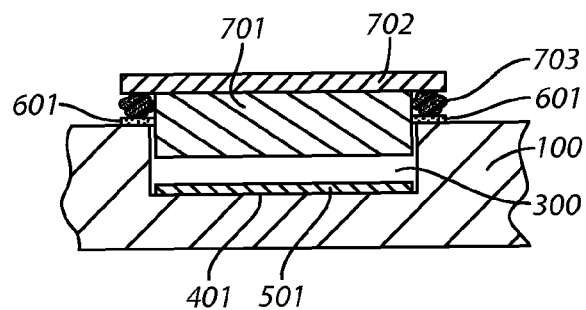
FIG. 9 is a detail side elevational sectioned view in accordance with the disclosure.

Referring to FIGS. 2, 8, and 9, at 206 and by one approach the assembly shown in FIG. 7 is juxtaposed with respect to the printed circuit board 100 such that the electronic component 701 is at least partially disposed within the cavity 300. When using adhesive 601 as described above, the adhesive 601 can serve to interact with and captivate the electrically-conductive foam 703 in place on the printed circuit board 100.

So configured, this arrangement provides good EMI shielding for the electronic component 701 as regards EMI sourced from beneath and/or the sides of the cavity 300 and even above the cavity 300. It will be noted that the EMI-shielding material 501 is physically-discrete from the electronic component in that the material 501 is physically separate from the electronic component 701 notwithstanding that the material 501 may physically contact the electronic component 701 once the latter is installed in the cavity 300.

By disposing the electronic component 701 at least partially within the cavity 300 of the circuit board 100, and regardless of whether the electronic component 701 is actually electrically coupled to the printed circuit board 100 or any component mounted thereon, the overall height of the described assembly is reduced. Accordingly, so configured, these teachings permit the use of one or more electronic components in conjunction with a given printed circuit board in an application where space limitations might otherwise forbid such a combination. In addition, these teachings provide EMI shielding for the electronic component. The described approaches are readily and economically deployed and can be easily facilitated using many already-available tools and manufacturing facilities.

The present disclosure may be embodied in other specific forms without departing from its essential characteristics. The described embodiments are to be considered in all respects only as illustrative and not restrictive. The scope of the disclosure is, therefore, indicated by the appended claims rather than by the foregoing description. All changes that come within the meaning and range of equivalency of the claims are to be embraced within their scope.

We claim:

1. An apparatus, comprising:
a printed circuit board having a cavity formed on a first side thereof, the cavity having side walls and a bottom;
a substrate positionable with respect to the circuit board;
an electronic component electrically connected to the substrate and positionable in connection with the substrate to be disposed at least partially in the cavity, with a portion of the electronic component extending above the first side of the printed circuit board; and
electromagnetic interference (EMI)-shielding foam disposed adjacent to at least a portion of the electronic component, the foam compressed between the substrate and the circuit board when the electronic component is disposed at least partially in the cavity.

2. The apparatus of claim 1 wherein the foam is disposed about substantially an entire periphery of the electronic component between the substrate and the printed circuit board.

3. The apparatus of claim 2 wherein the foam is held in place, at least in part, by electrically-conductive adhesive.

4. The apparatus of claim 1, further including EMI-shielding material disposed on at least one of:
the bottom of the cavity;
at least one side wall of the cavity.

5. The apparatus of claim 4 wherein the EMI-shielding is disposed on each of the bottom of the cavity and the side walls of the cavity.

6. An apparatus, comprising:
a printed circuit board having a cavity formed on a first side thereof, the cavity having side walls and a bottom;
a substrate positionable with respect to the circuit board;
an electronic component electrically connected to the substrate and positionable in connection with the substrate to be disposed at least partially in the cavity; and
electromagnetic interference (EMI)-shielding foam disposed adjacent to at least a portion of the electronic component, the foam compressed against the first side of the printed circuit board, between the substrate and the circuit board, when the electronic component is disposed at least partially in the cavity.

7. The apparatus of claim 1, wherein the substrate is a flexible electrical connector.

8. The apparatus of claim 1 wherein the electronic component is not electrically connected to the printed circuit board.

9. A method, comprising:
providing a printed circuit board having a cavity formed on a first side thereof, the cavity having side walls and a bottom;
providing a substrate positionable with respect to the circuit board;
installing an electronic component, electrically connected to the substrate, at least partially in the cavity with a portion of the electronic component extending above the first side of the printed circuit board; and
compressing an electromagnetic interference (EMI)-shielding foam adjacent to at least a portion of the electronic component when the electronic component is installed at least partially in the cavity.

10. The method of claim 9, further including installing electromagnetic interference (EMI)-shielding material on at least one of:
the bottom of the cavity;
at least one side wall of the cavity.

11. The method of claim 9, wherein installing the electronic component at least partially in the cavity further comprises, at least in part, compressing the foam onto an electrically-conductive adhesive disposed about at least a portion of the cavity.

12. The method of claim 9 wherein installing the electronic component at least partially in the cavity comprises installing the electronic component such that the electronic component is not electrically connected to the printed circuit board.

13. The method of claim 9 wherein the substrate includes electrically-conductive traces.

14. An apparatus, comprising:
a first circuit board having a cavity formed on a first side thereof, the cavity having side walls and a bottom;
a second circuit board positionable with respect to the first circuit board;
an electronic component electrically connected to the second circuit board and positionable in connection with the second circuit board to be disposed at least partially in the cavity and having a substantial portion extending above the cavity; and
electromagnetic interference (EMI)-shielding foam sized and dimensioned to surround at least a portion of the cavity and to be compressed between the first circuit board and the second circuit board when the electronic component is disposed at least partially in the cavity.

15. The apparatus of claim 14, wherein the foam is secured to one of the first and second circuit boards before the electronic component is disposed at least partially in the cavity.

16. The apparatus of claim 15, further including adhesive attached to the other of the first and second circuit board to which the foam is secured, wherein when the foam is compressed, the foam is adhered to the adhesive, thereby securing the foam to each of the first and second circuit boards.

17. The apparatus of claim 14, wherein the cavity includes electromagnetic interference shielding material physically discrete with respect to the foam.

18. The apparatus of claim 14, wherein the foam does not compress the electronic component.

19. The apparatus of claim 14, wherein the foam forms a hollow sleeve extending around the electronic component and contacting the first circuit board at a first end and the second circuit board at a second end opposite the first end.

* * * * *